United States Patent [19]

Togneri

[11] 4,223,371
[45] Sep. 16, 1980

[54] ROTATABLE AND EXPANDABLE CHASSIS AND CABINET

[76] Inventor: Mauro G. Togneri, P.O. Box 12818, Houston, Tex. 77017

[21] Appl. No.: 812,583

[22] Filed: Jul. 5, 1977

[51] Int. Cl.² ............................................. H02B 1/02
[52] U.S. Cl. ..................................... 361/391; 361/415
[58] Field of Search ......................... 361/415, 340, 391

[56] References Cited

U.S. PATENT DOCUMENTS

| | | | |
|---|---|---|---|
| 3,675,084 | 7/1972 | Jammaud | 361/391 |
| 3,683,238 | 8/1972 | Olds et al. | 361/391 |
| 3,689,128 | 9/1972 | Andreini et al. | 361/415 |
| 3,691,430 | 9/1972 | Freitag | 361/415 |
| 3,838,777 | 10/1974 | Thornicroft | 361/415 |

FOREIGN PATENT DOCUMENTS

| | | | |
|---|---|---|---|
| 819819 | 8/1969 | Canada | 361/415 |
| 878385 | 4/1953 | Fed. Rep. of Germany | 361/340 |
| 292694 | 7/1965 | Netherlands | 361/391 |
| 1044960 | 10/1966 | United Kingdom | 361/415 |

*Primary Examiner*—David Smith, Jr.

*Attorney, Agent, or Firm*—David M. Ostfeld

[57] ABSTRACT

A housing for printed circuit cards or modular assemblies that provides for easy access to the cards or assemblies as well as to interconnection buses and other equipment mounted in the housing is disclosed. The housing includes a cabinet having two fixed, substantially flat plates. The housing further includes a chassis having two substantially rectangular rotating plates. Each fixed plate of the cabinet has a rotating plate of the chassis connected to one side of it by means of two removable hinge pins such that the axis extending from the front to the back of the rotating plate extends perpendicular to the axis extending from the top to the bottom of the fixed plate when both hinge pins are in place. Orientation of the pins is such that by removing one pin, the rotating plate is rotatable about the other pin with respect to the fixed plate. The rectangular rotating plates are connected together by a system of bars forming the chassis on which printed circuit cards and other equipment can be mounted. By using bars of different lengths, any number of cards or assemblies can be accommodated.

12 Claims, 3 Drawing Figures

ROTATABLE AND EXPANDABLE CHASSIS AND CABINET

BACKGROUND OF THE INVENTION

1. Field of the Invention

The present invention relates generally to electronic chassis and cabinets.

2. Description of the Prior Art

Modular chassis of the prior art generally include a frame with an open front and a plurality of connectors for printed circuit cards positioned at the rear. Use of a chassis involves interconnecting such connectors with interconnection buses. The cards are then inserted into the front of the frame until they are mated with the connectors. The chassis is then usually enclosed by a cabinet. Additional electrical components, such as relays, may be attached directly to the frame or the cabinet and interconnected with the bus or the connectors.

Such chassis have enclosures of two general types. In one type, the enclosure fully encloses the chassis on all sides except the front. The enclosure and chassis combination may be portable or may be mounted on a wall or table. Generally, the back panel of the enclosure is removable to permit access to the connectors for interconnecting buses, installing electronic components, and making modifications or repairs. Several problems are encountered in using such chassis. The electronic components may interfere with making repairs or modifications on the connectors. Also, the buses themselves may interfere with making repairs or modifications on the electronic components. Additionally, if the unit is mounted such that the back panel is against the wall, the entire combination must be removed in order to make modifications or repairs.

The other type of enclosure includes racks on which a plurality of chassis can be mounted. Repairs and modifications can be made in any of several ways. If the chassis are drawer mounted, they may be pulled outwardly from the rack thus exposing the connectors, buses and electrical components. If the chassis is not drawer mounted, it can be removed from the rack and placed on a work surface. If the enclosures have rear access, such as a rear door or removable panel, repairs or modifications can be made through such access. None of these techniques, however, is satisfactory. Drawer mounting of the chassis is costly and results in wasted space. Also, carrying the chassis to a remote work area may result in damage. Additionally, the chassis may be too heavy to be easily carried. Moreover, a substantial amount of extra space is needed and additional expense is incurred if the enclosure has rear access.

Furthermore, the width of a rack mountable chassis is governed by the width of the rack. Therefore, the number of units that can be accommodated by a chassis is limited. Furthermore, wasted space results if the units do not take up the entire width of the chassis.

SUMMARY OF THE INVENTION

The present invention comprises a modular unit chassis cabinet combination. It is easily modifiable to accommodate virtually any number of printed circuit cards and other equipment, individually or formed together into modular units, while consuming a minimum amount of space. It permits quick, easy access to buses, connectors and electrical components mounted therein. The chassis of the invention includes two rotating plates connected together by bars on which the units, printed circuit cards, equipment, and interconnectors can be mounted. The cabinet includes two fixed, flat, generally rectangular plates. The fixed and rotating plates are held to one another on each side of the cabinet by two removable pins substantially perpendicular to the plates. The pins are oriented such that by removing one pin, the rotating plates are rotatable with respect to the fixed plates.

BRIEF DESCRIPTION OF THE DRAWINGS

For a further understanding of the nature and objects of the present invention, reference should be made to the following detailed description, taken in conjunction with the accompanying drawings, in which like parts are given like reference numerals and wherein.

DETAILED DESCRIPTION OF THE PREFERRED EMBODIMENT

Figure 1:
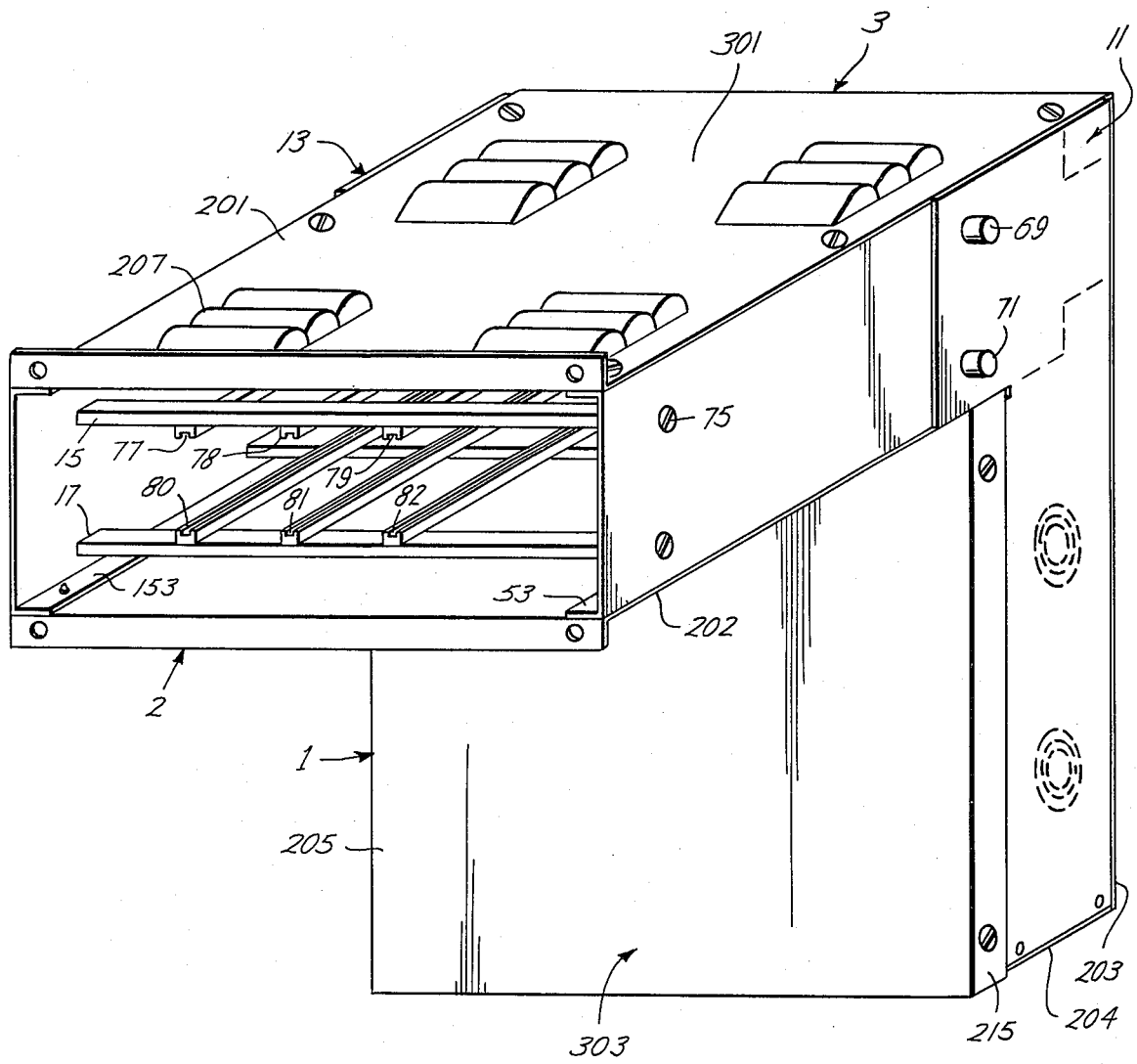
FIG. 1 is a perspective view of the preferred embodiment of the apparatus of the invention with the rotatable chassis portion in its normal position.
Figure 2:
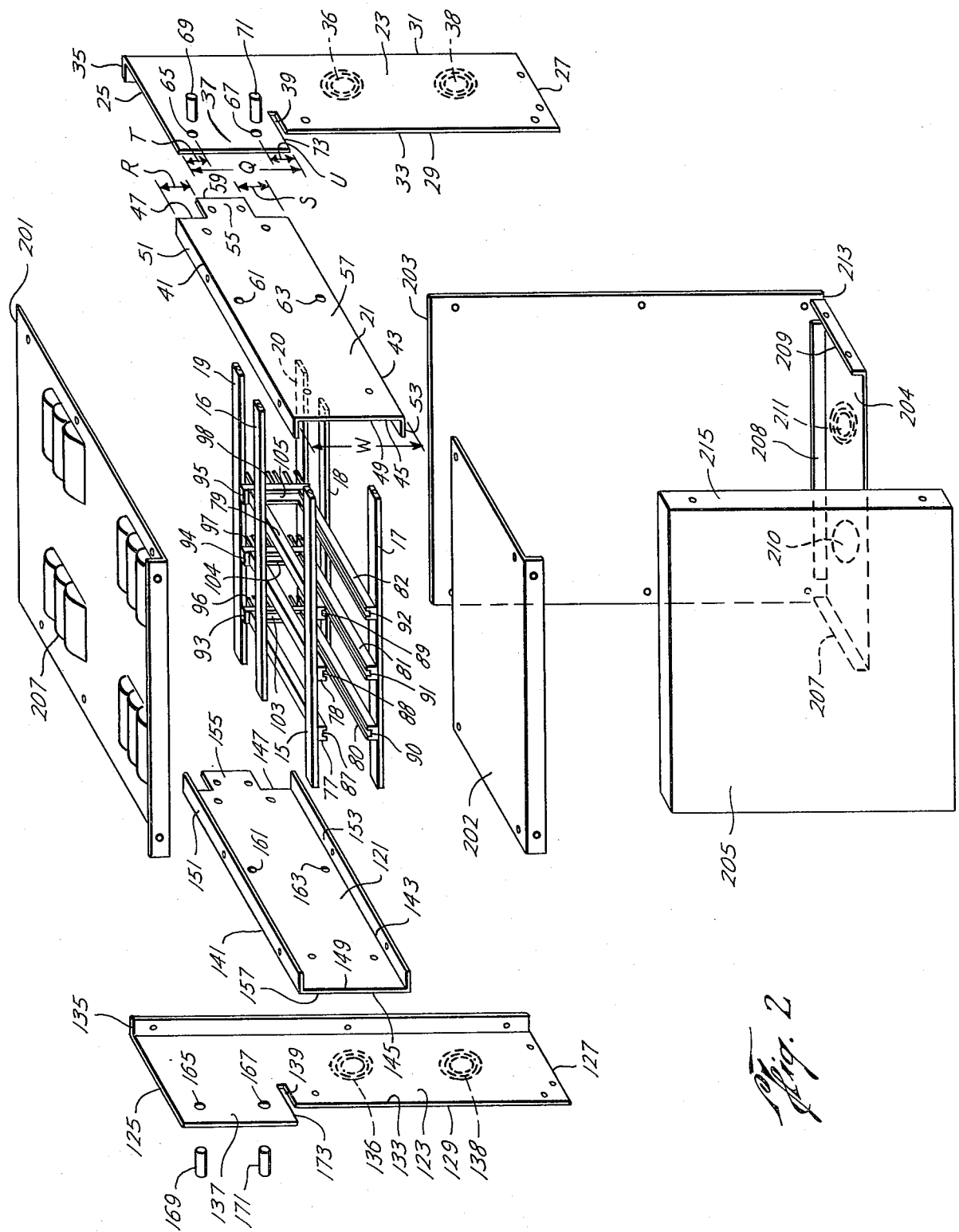
FIG. 2 is an exploded perspective view of the preferred embodiment of the apparatus of the invention.

As shown in FIGS. 1 and 2, the preferred embodiment of the invention comprises a housing having a cabinet 1 and a chassis 2. The housing includes a frame having end pieces 11, 13 connected to one another by the rods 15–20 of chassis 2. The chassis 2 includes one modular operating unit 3.

End piece 11 includes generally rectangular substantially flat rotating plate 21 of chassis 2 and generally rectangular substantially flat fixed plate 23 of cabinet 1. Fixed plate 23 has upper edge 25, lower edge 27, front edge 29 and rear edge 31. Rear edge 31 is bent toward inner surface 33 forming flange 35. Tab 37 juts from front edge 29 and extends a distance Q from upper edge 25. Front edge 29 has notch 39 directly beneath tab 37. The portion of fixed plate 23 beneath tab 37 has conduit knockouts 36, 38 stamped therein.

Rotating plate 21 has an effective width W equal to Q and has upper edge 41, lower edge 43, front edge 45, and rear edge 47. Upper edge 41 is bent toward inner surface 49 forming flange 51. Lower edge 43 is bent toward inner surface 49 forming flange 53. Tab 55 juts from rear edge 47 and extends from a point a distance R below upper edge 41 to a point a distance S above lower edge 43.

Outer surface 57 of rotating plate 21 juxtaposes a portion of inner surface 33 of fixed plate 23 such that a portion of upper edge 41 of rotating plate 21 is aligned with upper edge 25 of fixed plate 23 and such that rear edge 59 of tab 55 of rotating plate 21 is spaced a short distance from flange 35 of fixed plate 33. In this way, the plane of rotating plate 21 is parallel to the plane of fixed plate 23 and the axis of rotating plate 21 extending from the front to the rear of rotating plate 21, when the rotating plate is fixed as shown in FIG. 1, is perpendicular to the axis of fixed plate 23 extending from the top to the bottom of fixed plate 23.

Rotating plate 21 is attached to fixed plate 23 by means of hinge holes 61, 63 in rotating plane 21, holes 65, 67 in fixed plate 23, and hinge pins 69, 71 extending through the holes. Holes 61, 63, 65, 67 all have the same diameter. Hole 65 is positioned on tab 37 a distance T, which is less than R, below upper edge 25 of fixed plate 23 and is aligned with hole 61. Hole 67 is positioned on tab 37 a distance U, which is less than S, above lower edge 73 of tab 37 and is aligned with hole 63. Pins 69, 71 have diameters approximately the same as the diameter of holes 61, 63, 65, 67. Pin 69 is removably disposed in holes 61, 65 and pin 71 is removably disposed in holes 63, 67 such that pins 69, 71 are perpendiclar to the plane of fixed plate 23 and the plane of rotating plate 21.

End piece 13 is a mirror image of end piece 11 and includes substantially flat rotating plate 121 and fixed plate 123 connected together such that their planes are parallel to one another by means of holes 161, 163 in rotating plate 121, holes 165, 167 in fixed plate 123, and hinge pins 169, 171, pins 169, 171 being perpendicular to the plane of rotating plate 121 and the plane of fixed plate 123.

Each of rods 15–20 are normal to and abut inner surface 49 of rotating plate 21 at one end and inner surface 149 of rotating plate 121 at the other end. Each rod is connected to rotating plates 21, 121 by means of screws 75 extending through rotating plates 21, 121 and engaging screw threads disposed in the respective ends of rods 15–20.

Rods 15, 16 are evenly positioned, just below upper edges 41, 141 of rotating plates 21, 121, respectively. Rod 15 is recessed a short distance behind front edges 45, 145, and rod 16 is recessed a short distance in front of rear edges 47, 147. Rods 17, 18 are evenly positioned just above lower edges 43, 143 and directly below rods 15, 16, respectively. Rods 19, 20 are evenly positioned a short distance behind rear edges 47, 147 and abut tabs 55, 155. Rod 19 is spaced a greater distance below upper edges 41, 141 than are rods 15, 16. Rod 20 is spaced a greater distance above lower edges 43, 143 than are rods 17, 18.

Card guides 77–79 having slots 87–89, respectively, are connected between rods 15 and 16. Guides 77–79 are spaced from one another and are substantially parallel to end pieces 11, 13. Card guides 80–82 having slots 90–92, respectively, are connected between rods 17 and 18. Guides 80–82 are substantially parallel to end pieces 11, 13 and are positioned directly beneath guides 77–79, respectively, so that slots 90–92 are aligned with slots 87–89, respectively.

Printed circuit card edge connectors 93–95 have female socket portions 103–105, respectively, for receiving the edge of printed circuit cards. Connectors 93–95 also have wire wrap pin sets 96–98, respectively. Each connector is attached between rods 19 and 20 and is substantially parallel to end pieces 11, 13. Female socket portion 103 of connector 83 is aligned with the slots 87, 90 of card guides 77 and 80. Female socket portion 104 of connector 84 is aligned with the slots 88, 91 of card guides 78 and 81. Female socket portion 105 of connector 85 is aligned with the slots 89, 92 of card guides 79 and 83.

In order to protect the interior of the frame of the cabinet 1 of the invention, cover plates 201–205 are connected between end pieces 11, 13. Top cover plate 201 of chassis 2, having louvres 207 for allowing circulation of air, is connected between flanges 51, 151 of rotating plates 21, 121, respectively. Bottom cover plate 202 of chassis 2 is connected between flanges 53, 153 of rotating plates 21, 121, respectively. Bottom cover plate 202 extends from front edges 45, 145 of rotating plates 21, 121, respectively, to a point just beyond front edges 29, 129 of fixed plates 23, 123, respectively. Flat back cover plate 203 is connected between flanges 35, 135 of fixed plates 23, 123, respectively, and covers the entire area between flanges 35, 135. Base cover plate 204 has flanges 207, 208, 209 on three edges and conduit knockouts 210, 211 stamped thereon. Base cover plate 204 is attached between lower edges 27, 127 of fixed plates 23, 123 and is also attached to lower edge 213 of back cover plate 203. Front cover plate 205 has flange 215 extending about its entire perimeter. Front cover plate 205 is attached between front edges 29, 129 of fixed plates 23, 123 such that the portion of flange 215 at the upper edge of front cover plate 205 extends into notches 39, 139 and the portion of flange 215 at the lower edge of front cover plate 205 extends beneath base cover plate 204.

The preferred embodiment of the invention can be put into operation by interconnecting wire wrap pin sets 96–98 with wires. Electronic components, such as transformers and relays, can be mounted on surfaces 33, 133 of fixed plates 23, 123. Such components can be connected by wire to pin sets 96–98. All the components within the chassis, including connectors 93–95, can be connected to one or more conduits that enter the chassis through the conduit knockouts. All wires between the chassis mounted components and conduits and between the chassis components and the fixed plate components should have sufficient length to permit movement of connectors 93–95 with respect to such conduits and components as described infra.

When the pin sets 96–98 of chassis 2 have been wired, chassis 2 can be mounted in the cabinet 1. Cabinet 1 can be mounted on a wall such that rear edges 31, 131 of fixed plates 23, 123 abut the wall. Cards or other modular assemblies (not shown) having printed circuit card edges at top and bottom and a printed circuit male connector at the rear can be placed in chassis 2 by inserting them into the card guides and connectors. By appropriate connection of the conduit and fixed components with the pin sets 96–98, the cards or assemblies can then be operated as desired.

Figure 3:
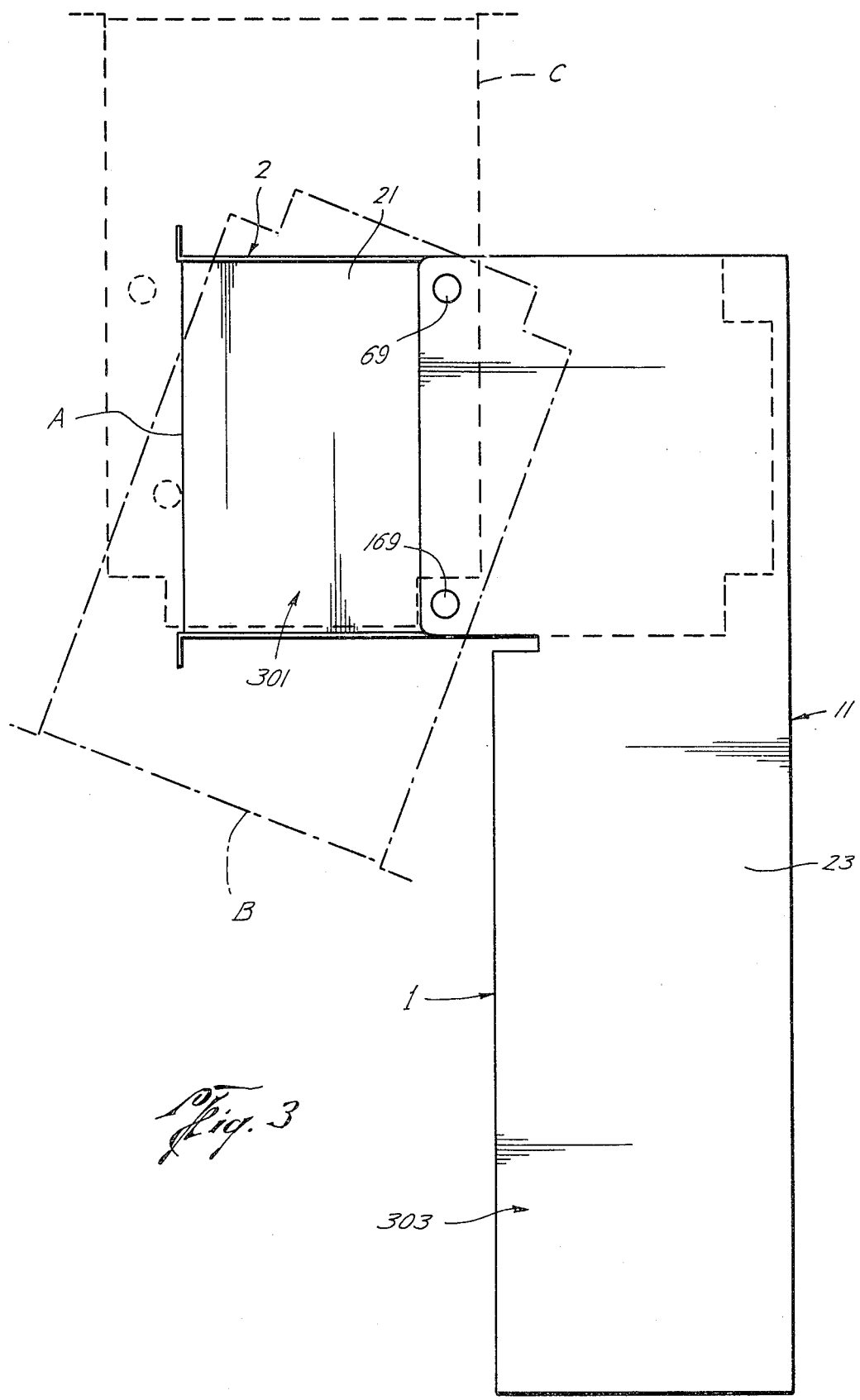
FIG. 3 is a side elevation of the preferred embodiment of the invention with the rotatable cage in its normal position and with broken lines showing two positions achievable by the rotatable chassis portion during rotation.

When modification or repair of the chassis wiring becomes necessary, chassis 2 need not be removed from cabinet 1, and cabinet 1 need not be removed from the wall. Instead, pins 69, 169 are removed from their respective holes. As shown in FIG. 3, chassis 2 is then rotated about pins 71, 171 such that wire wrap pin sets 96–98 are fully exposed. (From Position A to Position B). This rotation also serves to separate the wire connections in chassis 2 from those in fixed cabinet 1 so that the conduits and components in fixed cabinet 1 do not interfere with work on the connections in rotatable chassis 2.

If work on the separate components or the conduit is necessary, front cover plate 205 is removed. If the work also involves wire wrap pin sets 96–98, pins 71, 171 are removed. Chassis 2 is then rotated to position C about pins 69, 169.

As shown in FIG. 3, the rotation of the end plate from position A to position B and back, and from position A to position C takes place within a single plane.

In order to expand chassis 2 to accommodate additional printed circuit cards, longer rods are used to connect the rotating plates, and additional card guides and connectors are used. For wider printed circuit cards, the card guides and connectors may be spaced farther apart. In either case, wider cover plates can be used. In this way, the end plates need not be modified to accommodate any number of printed circuit cards.

Although the system described in detail supra is most satisfactory and preferred, many variations in structure are possible. For example, the system described in detail is designed to accomodate three printed circuit cards. The system may be constructed to accomodate a larger or smaller number of cards or assemblies by including additional card guides and connectors or by removing two or more of the card guides and one or more of the connectors. For optimum use of space, the bars can be lengthened or shortened. The cover plates can also be designed to have varying widths. Additionally, in the preferred embodiment, chassis 2 consists of one modular unit 3. However, several modular units may form chassis 2. The units could be interconnected to each other, such as, for example, by removable connecting strips.

The above are examples of the possible changes or variations.

Because many varying and different embodiments may be made within the scope of the inventive concept herein taught and because many modifications may be made in the embodiment herein detailed in accordance with the descriptive requirements of the law, it should be understood that the details herein are to be interpreted as illustrative and not in a limiting sense.

What is claimed as invention is:

1. A housing for electronic circuits, comprising:
   a first end plate having a substantially flat first fixed plate, a substantially flat first rotating plate and a first connecting means for securing said first rotating plate to said first fixed plate such that the plane of said first rotating plate is parallel to the plane of said first fixed plate and such that said first rotating plate, with respect to said first fixed plate, can be selectively (1) fixed, (2) rotatable within a first single plane about a first axis and (3) rotatable within said first single plane about a second axis separate from said first axis;
   a second end plate having a substantially flat second fixed plate, a substantially flat second rotating plate and a second connecting means for securing said second rotating plate to said second fixed plate such that the plane of said second rotating plate is parallel to the plane of said second fixed plate and such that said second rotating plate, with respect to said second fixed plate, can be selectively (1) fixed, (2) rotatable within a second single plane about said first axis and (3) rotatable within said second single plane about said second axis; and
   third connecting means for connecting said first end plate to said second end plate such that the planes of said first fixed and rotating plates are parallel to the planes of said second fixed and rotating plates.

2. The housing as recited in claim 1 wherein said first connecting means includes a first opening and a second opening through said first fixed plate, a first opening and a second opening through said first rotating plate, a portion of said first rotating plate juxtaposing a portion of said first fixed plate such that said first opening through said first fixed plate is aligned with said first opening through said first rotating plate and with said first axis and said second opening through said first fixed plate is aligned with said second opening through said first rotating plate and with said second axis, said first connecting means further including a first pin removably disposed in said aligned first openings of said first fixed and rotating plates and a second pin removably disposed in said aligned second openings of said first fixed and rotating plates, said first and second pins of said first connecting means being perpendicular to the planes of said first fixed and rotating plates; and
   said second connecting means includes a first opening and a second opening through said second fixed plate, a first opening and a second opening through said second rotating plate, a portion of said second rotating plate juxtaposing a portion of said second fixed plate such that said first opening through said second fixed plate is aligned with said first opening through said second rotating plate and with said first axis and said second opening through said second fixed plate is aligned with said second opening through said second rotating plate and with said second axis, said second connecting means further including a first pin removably disposed in said aligned first openings of said second fixed and rotating plates and a second pin removably disposed in said aligned second openings of said second fixed and rotating plates, said first and second pins of said second connecting means being perpendicular to the planes of said second fixed and rotating plates.

3. The housing as recited in claim 2 wherein said first rotating plate is substantially rectangular in shape and has an axis of symmetry, said first fixed plate is substantially rectangular in shape and has an axis of symmetry, said axis of symmetry of said first fixed plate being perpendicular to said axis of symmetry of said first rotating plate when said first rotating plate is fixed relative to said first fixed plate, and
   said second rotating plate is substantially rectangular in shape and has an axis of symmetry, said second fixed plate is substantially rectangular in shape and has an axis of symmetry said axis of symmetry of said second fixed plate being perpendicular to said axis of symmetry of said second rotating plate when said second rotating plate is fixed relative to said first fixed plate.

4. The housing as recited in claim 3 wherein said first fixed plate includes an upper edge extending perpendicular to the axis of symmetry of said first fixed plate, and a front edge extending parallel to the axis of symmetry of said first fixed plate, and a tab extending from said front edge adjacent said upper edge, said first and second openings through said first fixed plate being located on said tab of said first fixed plate; and
   said second fixed plate includes an upper edge extending perpendicular to the axis of symmetry of said second fixed plate, and a front edge extending parallel to the axis of symmetry of said second fixed plate, and a tab extending from said front edge adjacent said upper edge, said first and second openings through said second fixed plate being located on said tab of said second fixed plate.

5. The housing as recited in claim 4 wherein said first rotating plate includes a top edge and a bottom edge extending parallel to said axis of symmetry of said first rotating plate, a rear edge extending perpendicular to said axis of symmetry of said first rotating plate, and a tab extending from said rear edge of said first rotating plate, said tab of said first rotating plate having top and bottom tab edges extending parallel to said top and bottom edges of said first rotating plate, said top and bottom tab edges intersecting said rear edge of said first rotating plate at points spaced below and above said top and bottom edges, respectively, of said first rotating plate, and a rear tab edge extending parallel to said rear edge of said first rotating plate, and said first fixed plate includes a rear edge extending parallel to and opposite said front edge of said first fixed plate, said rear tab edge of said first rotating plate being aligned slightly in front of said rear edge of said first fixed plate when said first rotating plate is fixed relative to said first fixed plate; and said second rotating plate includes a top edge and a bottom edge extending parallel to said axis of symmetry of said second rotating plate, a rear edge extending perpendicular to said axis of symmetry of said second rotating plate, and a tab extending from said rear edge of said second rotating plate, said tab of said second rotating plate having top and bottom tab edges extending parallel to said top and bottom edges of said second rotating plate, said top and bottom tab edges intersecting said rear edge of said second rotating plate at points spaced below and above said first and second edges, respectively, of said second rotating plate, and a rear tab edge extending parallel to said rear edge of said second rotating plate, and said second fixed plate includes a rear edge extending parallel to and opposite said front edge of said second fixed plate, said rear tab edge of said second rotating plate being aligned slightly in front of said rear edge of said second fixed plate when said second rotating plate is fixed relative to said second fixed plate.

6. The housing as recited in claim 5 wherein said first rotating plate has a width approximately equal to the length of said first fixed plate tab;

said second rotating plate has a width approximately equal to the length of said second fixed plate tab;

said top edge of said first rotating plate is aligned with said top edge of said first fixed plate and said top edge of said second rotating plate is aligned with said top edge of said second fixed plate;

said top tab edge of said tab extending from said rear edge of said first rotating plate is spaced a first distance below said top edge of said first rotating plate and said bottom tab edge of said first rotating plate tab is spaced a second distance above said bottom edge of said first rotating plate, said top tab edge of said tab extending from said rear edge of said second rotating plate is spaced a third distance substantially equal to the first distance below said top edge of said second rotating plate and said bottom tab edge of said second rotating plate tab is spaced a fourth distance substantially equal to the second distance above said bottom edge of said second rotating plate, said first opening through said first rotating plate is centered a fifth distance below said top edge of said first rotating plate, the fifth distance being less than the first distance, and said second opening through said first rotating plate is centered a sixth distance above said bottom edge of said first rotating plate, the sixth distance being less than the second distance, and said first opening through said second rotating plate is centered a seventh distance below said top edge of said second rotating plate, the seventh distance being less than the third distance and said second opening through said second rotating plate is centered an eighth distance above said bottom edge of said second rotating plate, the eighth distance being less than the fourth distance.

7. The housing as recited in claim 6 further comprising a back cover plate extending between said rear edges of said first and second fixed plates and a front cover plate extending between said front edges of said first and second fixed plates.

8. The housing as recited in claim 2 wherein said first opening in said first fixed plate is located directly above said second opening in said first fixed plate; and wherein said first opening in said second fixed plate is located directly above said second opening in said second fixed plate.

9. The housing as recited in claim 1 wherein said third connecting means includes a plurality of elongate bars extending between said first rotating plate and said second rotating plate, each bar being connected to said first rotating plate at one end and said second rotating plate at the other end.

10. The housing as recited in claim 9 further comprising:

accommodation means for accommodating modular electronic assemblies, wherein said accommodation means includes a plurality of card guides connected to said bars and a plurality of printed circuits card edge connectors connected to said bars.

11. The housing as recited in claim 1 wherein said third connecting means includes a plurality of cover plates extending between said first end plate and said second end plate.

12. A housing for electronic circuits comprising:
a fixed cabinet;
a rotatable chassis; and
connection means for securing said chassis to said cabinet such that said chassis can, with respect to said cabinet and while remaining secured to said cabinet be selectively (1) fixed, (2) rotated about a first axis and (3) rotated about a second axis separate from said first axis, wherein said cabinet and said chassis each have an axis of symmetry and a substantially rectangular cross section, said connection means securing said chassis to said cabinet such that when said chassis is fixed with respect to said cabinet, the axis of symmetry of said chassis is perpendicular to the axis of symmetry of said cabinet, and wherein said cabinet has first and second end plates and said chassis has first and second end plates, the planes of all of said end plates being parallel to one another, and the outside surface of a portion of said first end plate of said chassis juxatposes the inside surface of a portion of said first end plate of said cabinet and the outside surface of a portion of said second end plate of said chassis juxtaposes the inside surface of a portion of said second end plate of said cabinet; and wherein said connection means includes first and second openings through each of said end plates, each of said first openings being aligned with one another and with said first axis and each of said second openings being aligned with one another and with said second axis; and a first pin removably disposed in said aligned first openings of said first end plates, a second pin removably disposed in said aligned second openings of said first end plates, a third pin removably disposed in said aligned first openings of said second end plates, and a fourth pin removably disposed in said aligned second openings of said second end plates, all of said pins being perpendicular to the planes of said end plates.

* * * * *